United States Patent
Chatterjee et al.

(10) Patent No.: US 11,808,832 B2
(45) Date of Patent: Nov. 7, 2023

(54) SYSTEM AND METHOD FOR DEEP LEARNING-BASED GENERATION OF TRUE CONTRAST IMAGES UTILIZING SYNTHETIC MAGNETIC RESONANCE IMAGING DATA

(71) Applicant: GE PRECISION HEALTHCARE LLC, Wauwatosa, WI (US)

(72) Inventors: Sudhanya Chatterjee, Bangalore (IN); Dattesh Dayanand Shanbhag, Bangalore (IN)

(73) Assignee: GE Precision Healthcare LLC, Wauwatosa, WI (US)

( * ) Notice: Subject to any disclaimer, the term of this patent is extended or adjusted under 35 U.S.C. 154(b) by 391 days.

(21) Appl. No.: 17/344,274

(22) Filed: Jun. 10, 2021

(65) Prior Publication Data
US 2022/0397627 A1 Dec. 15, 2022

(51) Int. Cl.
*G06T 7/00* (2017.01)
*G01R 33/565* (2006.01)
*G06N 3/084* (2023.01)

(52) U.S. Cl.
CPC ...... *G01R 33/56554* (2013.01); *G06N 3/084* (2013.01); *G06T 7/0012* (2013.01);
(Continued)

(58) Field of Classification Search
CPC .............. G01R 33/56554; G01R 33/50; G01R 33/565; G01R 33/5602; G01R 33/5611;
(Continued)

(56) References Cited

U.S. PATENT DOCUMENTS

| 10,635,943 B1* | 4/2020 | Lebel ................ G06V 10/764 |
| 2010/0142789 A1* | 6/2010 | Chang ............... G01R 33/5608 |
| | | 600/410 |

(Continued)

OTHER PUBLICATIONS

Tanenbaum, L.N., et al.; "Synthetic MRI for Clinical Neuroimaging: Results of the Magnetic Resonance Image Compilation (MAGiC) Prospective, Multicenter, Multireader Trial"; American Society of Neuroradiology, 2017, pp. 1-8.

(Continued)

*Primary Examiner* — Van D Huynh
(74) *Attorney, Agent, or Firm* — Fletcher Yoder P.C.

(57) ABSTRACT

A computer-implemented method for generating an artifact corrected reconstructed contrast image from magnetic resonance imaging (MRI) data is provided. The method includes inputting into a trained deep neural network both a synthesized contrast image derived from multi-delay multi-echo (MDME) scan data or the MDME scan data acquired during a first scan of an object of interest utilizing a MDME sequence and a composite image, wherein the composite image is derived from both the MDME scan data and contrast scan data acquired during a second scan of the object of interest utilizing a contrast MRI sequence. The method also includes utilizing the trained deep neural network to generate the artifact corrected reconstructed contrast image based on both the synthesized contrast image or the MDME scan data and the composite image. The method further includes outputting from the trained deep neural network the artifact corrected reconstructed contrast image.

20 Claims, 6 Drawing Sheets

(52) U.S. Cl.
CPC ............... *G06T 2207/10088* (2013.01); *G06T 2207/20081* (2013.01); *G06T 2207/20084* (2013.01)

(58) Field of Classification Search
CPC ............ G01R 33/5617; G01R 33/5608; G06N 3/084; G06N 3/044; G06N 3/0455; G06N 3/0464; G06N 3/047; G06N 3/0475; G06N 3/09; G06N 3/08; G06T 7/0012; G06T 2207/10088; G06T 2207/20081; G06T 2207/20084; G06T 11/008
See application file for complete search history.

(56) References Cited

U.S. PATENT DOCUMENTS

| | | | | |
|---|---|---|---|---|
| 2019/0104940 | A1* | 4/2019 | Zhou | G06T 11/008 |
| 2019/0277935 | A1* | 9/2019 | Zeng | G06T 5/002 |
| 2019/0377047 | A1* | 12/2019 | Chen | G01R 33/5608 |
| 2020/0058106 | A1* | 2/2020 | Lazarus | G06V 10/774 |
| 2020/0305806 | A1* | 10/2020 | Tang | G06N 3/084 |
| 2020/0341094 | A1* | 10/2020 | Polak | A61B 5/7207 |
| 2021/0012543 | A1* | 1/2021 | Hein | G06T 11/005 |
| 2021/0123999 | A1* | 4/2021 | An | G01R 33/567 |
| 2021/0225047 | A1* | 7/2021 | Pawar | G06N 3/045 |
| 2021/0295474 | A1* | 9/2021 | Wang | G06N 3/084 |
| 2021/0302525 | A1* | 9/2021 | Mandava | A61B 5/055 |
| 2022/0028133 | A1* | 1/2022 | Ewald | G06T 11/008 |

OTHER PUBLICATIONS

Hagiwara, A., et al.; "Improving the Quality of Synthetic FLAIR Images with Deep Learning Using a Conditional Generative Adversarial Network for Pixel-by-Pixel Image Translation"; American Society of Neuroradiology, 2019, pp. 1-7.

Wang, Guanhua, et al.; "Synthesize High-Quality Multi-Contrast Magnetic Resonance Imaging from Multi-Echo Acquisition Using Multi-task Deep Generative Model"; IEEE Transations on Medical Imaging, vol. 39, No. 10, Oct. 2020, pp. 1-11.

* cited by examiner

SYSTEM AND METHOD FOR DEEP LEARNING-BASED GENERATION OF TRUE CONTRAST IMAGES UTILIZING SYNTHETIC MAGNETIC RESONANCE IMAGING DATA

BACKGROUND

The subject matter disclosed herein relates to medical imaging and, more particularly, to systems and methods for deep learning-based generation of true contrast images utilizing synthetic magnetic resonance imaging data.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

In conventional MRI, in order to generate multiple image contrasts for an object of interest, separate scans are conducted with each scan lasting several minutes for each type of contrast. Recently, a technique has been developed to reduce scan time by synthetically generating multiple image contrasts from MRI data acquired in a single scan. However, some of these synthetically generated MR contrast images lack the quality of conventionally acquired MR contrast images. For example, the synthetically generated MR contrast images may include artifacts (e.g., artificial brightening in certain areas of the imaged structure) that hinder the diagnostic value of the synthetically generated MR contrast images. Attempts to address these issues have mainly focused on utilizing deep learning-based techniques that still involve generating completely synthesized MR contrast images.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method for generating an artifact corrected reconstructed contrast image from magnetic resonance imaging (MRI) data is provided. The method includes inputting into a trained deep neural network both a synthesized contrast image derived from multi-delay multi-echo (MDME) scan data or the MDME scan data acquired during a first scan of an object of interest utilizing a MDME sequence and a composite image, wherein the composite image is derived from both the MDME scan data and contrast scan data acquired during a second scan of the object of interest utilizing a contrast MRI sequence. The method also includes utilizing the trained deep neural network to generate the artifact corrected reconstructed contrast image based on both the synthesized contrast image or the MDME scan data and the composite image. The method further includes outputting from the trained deep neural network the artifact corrected reconstructed contrast image.

In another embodiment, a deep learning-based artifact correction system for generating an artifact corrected reconstructed contrast image from magnetic resonance imaging (MRI) data is provided. The system includes a memory encoding processor-executable routines. The system also includes a processing component configured to access the memory and to execute the processor-executable routines, wherein the routines, when executed by the processing component, cause the processing component to perform actions. The actions include inputting into a trained deep neural network both a synthesized contrast image derived from multi-delay multi-echo (MDME) scan data or the MDME scan data acquired during a first scan of an object of interest utilizing a MDME sequence and a composite image, wherein the composite image is derived from both the MDME scan data and contrast scan data acquired during a second scan of the object of interest utilizing a contrast MRI sequence, wherein image intensity of the MDME scan data is normalized to an image intensity of the contrast scan data prior to generation of the composite image. The actions also include utilizing the trained deep neural network to generate the artifact corrected reconstructed contrast image based on both the synthesized contrast image or the MDME scan data and the composite image. The actions further include outputting from the trained deep neural network the artifact corrected reconstructed contrast image.

In a further embodiment, a non-transitory computer-readable medium, the computer-readable medium including processor-executable code that when executed by a processor, causes the processor to perform actions. The actions include inputting into a trained deep neural network both a synthesized contrast image derived from multi-delay multi-echo (MDME) scan data or the MDME scan data acquired during a first scan of an object of interest utilizing a MDME sequence and a composite image, wherein the composite image is derived from both the MDME scan data and contrast scan data acquired during a second scan of the object of interest utilizing a contrast MRI sequence, wherein image intensity of the MDME scan data is normalized to an image intensity of the contrast scan data prior to generation of the composite image. The actions also include utilizing the trained deep neural network to generate an artifact corrected reconstructed contrast image based on both the synthesized contrast image or the MDME scan data and the composite image. The actions further include outputting from the trained deep neural network the artifact corrected reconstructed contrast image.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
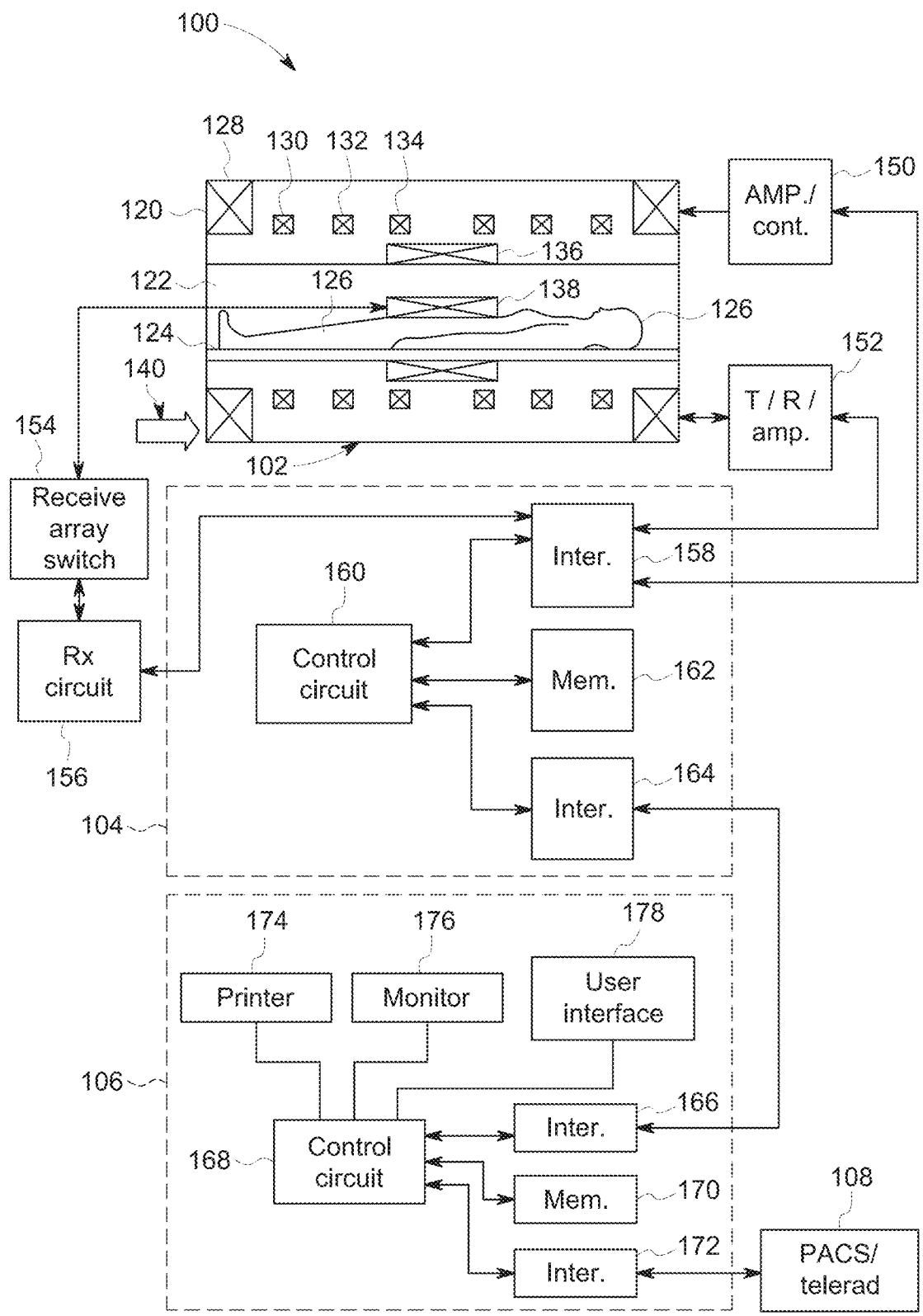
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

Deep-learning (DL) approaches discussed herein may be based on artificial neural networks, and may therefore encompass one or more of deep neural networks, fully connected networks, convolutional neural networks (CNNs), unrolled neural networks, perceptrons, encoders-decoders, recurrent networks, wavelet filter banks, u-nets, general adversarial networks (GANs), dense neural networks, or other neural network architectures. The neural networks may include shortcuts, activations, batch-normalization layers, and/or other features. These techniques are referred to herein as DL techniques, though this terminology may also be used specifically in reference to the use of deep neural networks, which is a neural network having a plurality of layers.

As discussed herein, DL techniques (which may also be known as deep machine learning, hierarchical learning, or deep structured learning) are a branch of machine learning techniques that employ mathematical representations of data and artificial neural networks for learning and processing such representations. By way of example, DL approaches may be characterized by their use of one or more algorithms to extract or model high level abstractions of a type of data-of-interest. This may be accomplished using one or more processing layers, with each layer typically corresponding to a different level of abstraction and, therefore potentially employing or utilizing different aspects of the initial data or outputs of a preceding layer (i.e., a hierarchy or cascade of layers) as the target of the processes or algorithms of a given layer. In an image processing or reconstruction context, this may be characterized as different layers corresponding to the different feature levels or resolution in the data. In general, the processing from one representation space to the next-level representation space can be considered as one 'stage' of the process. Each stage of the process can be performed by separate neural networks or by different parts of one larger neural network.

The present disclosure provides systems and methods for deep learning-based generation of true (i.e., equivalent to conventional) contrast images from synthetic MRI data. In particular, a trained deep neural network (e.g., deep learning module or distance between indices of simulation and observation (DISO) model) is utilized to reconstruct artifact corrected contrast images (i.e., true contrast images). Composite data or a composite image may be generated by grafting portions of k-space data (unacquired k-space) from a synthesized contrast image or image into contrast data or a contrast image (contrast-only image) containing at least a center portion of k-space data with or without other k-space regions away from the center. The scans for acquiring the data for the synthesized contrast images and the contrast image may occur a single continuous imaging session (i.e., where the scans occur serially in response to a single start signal or input (e.g., single-click)). Prior to grafting, the image intensity of the synthesized contrast image may be normalized to the image intensity of the contrast image. The artifact corrected reconstructed contrast images outputted by the trained deep neural network have fewer artifacts than synthesized contrast images for the same contrast type. In addition, the artifact corrected reconstructed images are of similar diagnostic quality as conventionally acquired contrast images. Thus, the disclosed embodiments enable the generation of true contrast images while still utilizing data acquired utilizing the MDME sequence in a single-click multi-contrast imaging scheme.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, BO, which is generally aligned with the bore 122. A series of gradient coils 130, 132, and 134 permit controlled magnetic gradient fields to be generated for positional encoding of certain of the gyromagnetic nuclei within the patient 126 during examination sequences. A radio frequency (RF) coil 136 is configured to generate radio frequency pulses for exciting the certain gyromagnetic nuclei within the patient. In addition to the coils that may be local to the scanner 102, the system 100 also includes a set of receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain of the gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input 44 (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuit 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuit 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuit 104 and system control circuit 106. In certain embodiments, the control and analysis circuit 160, while illustrated as a single unit, may include one or more hardware devices. The system control circuit 106 includes an interface circuit 166, which receives data from the scanner control circuit 104 and transmits data and commands back to the scanner control circuit 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, the memory circuit 170 may store one or more neural networks for reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
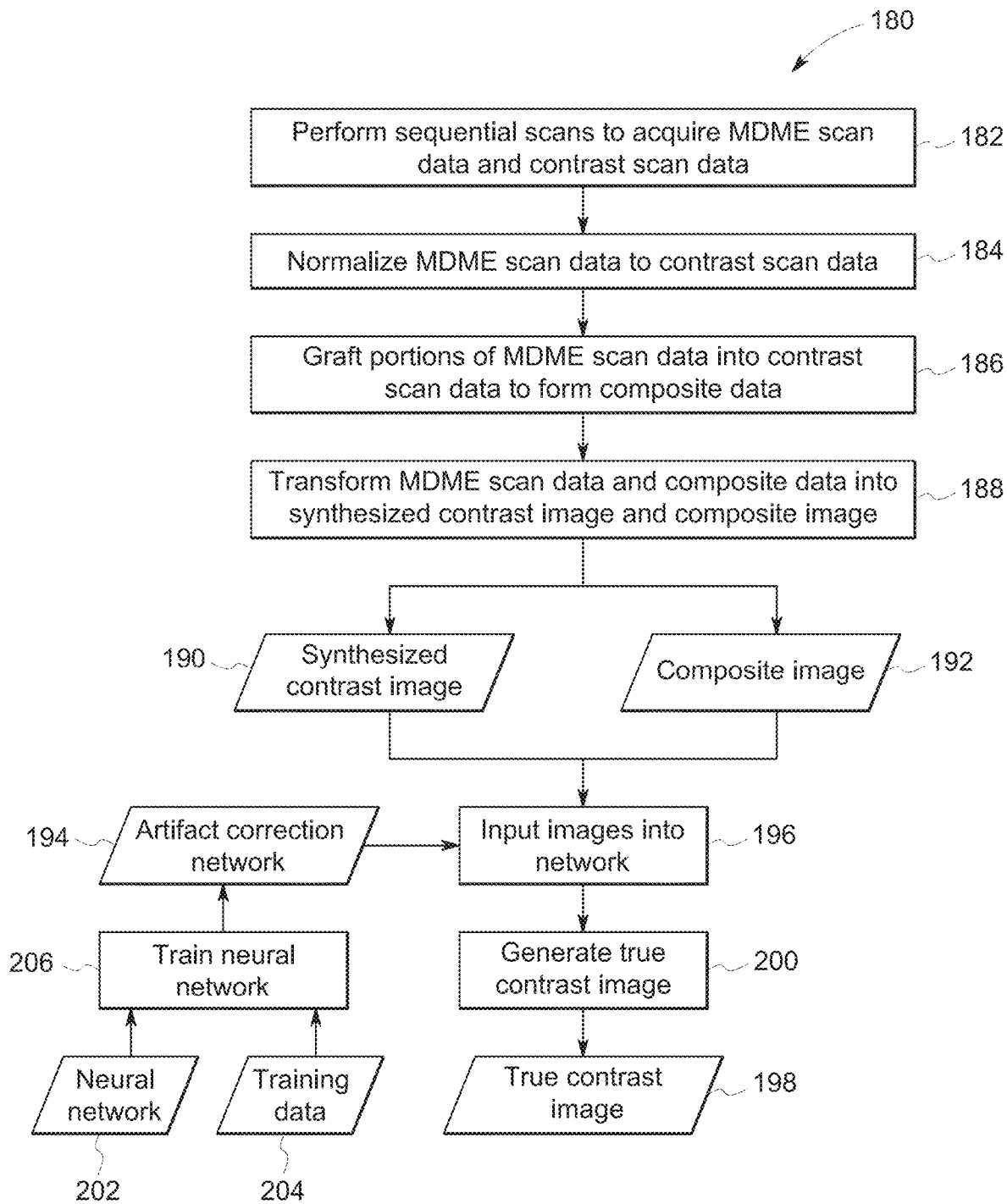
FIG. 2 is a flow chart of a method for DL-based MRI reconstruction of a true contrast image, in accordance with aspects of the present disclosure.

FIG. 2 is a flow chart of a method 180 for DL-based MRI reconstruction of a true contrast image (e.g., artifact corrected reconstructed contrast image) equivalent to a conventional contrast image. One or more components of the MRI system 100 in FIG. 1 may be utilized for performing the method 180. One or more steps of the method 180 may be performed simultaneously or in a different order from that depicted in FIG. 2. The method 180 includes performing sequential scans on a same object of interest or subject (e.g., for a region such as the brain) to acquire MDME scan data (e.g., for all spin echo sequences) and contrast scan data, respectively (block 182). The raw MDME scan data and contrast scan data are k-space data. In particular, a quantitative scan is performed utilizing a MDME sequence. Multiple image contrasts may be generated from the MDME scan data acquired in a single scan. In particular, MR signals acquired with the MDME sequence may be utilized to synthesize computer parameter maps (e.g., T1 map, T2 map, proton density map, etc.) based on a pre-defined model which describes MR signal behavior pixel by pixel (or voxel by voxel). The parameter maps and operator-specified parameters (e.g., TE, TR, delay) are then used to generate synthesized images (e.g., T1- and T2-weighted, T1- and T2-FLAIR, STIR, DIR, and/or proton density-weighted images) based on the model pixel by pixel (or voxel by voxel). The synthesized contrast image is comparable to those contrast images generated using operator-specified parameters in an actual or conventional MR scan. However, these synthesized contrast images may include artifacts (e.g., artificial brightening) that make these synthesized contrast images less desirable for diagnostic purposes.

As part of the sequential scans, an accelerated contrast scan (e.g., with an acceleration factor of 2×, 3×, 4×, 5×, etc.) is performed utilizing an MRI contrast sequence (e.g., T1- and T2-weighted, T1- and T2-FLAIR, STIR, DIR, and/or proton density-weighted) for a particular contrast type. The accelerated scan may be performed utilizing parallel imaging technique (e.g., where signals from individual coils are amplified, digitized, and processed simultaneously along separate channels) to reduce scan time. The contrast scan data is undersampled or partial k-space data. The contrast scan data from the accelerated scan may be only low-frequency contrast-only scan data. In certain embodiments, the contrast scan data only includes center lines or center k-space for providing contrast information. For example, for the following acceleration factors of 2×, 3×, 4×, 5×, the contrast scan data includes 50, 33, 25, and 20 percent center filled k-space, respectively. In other embodiments, the contrast scan data includes the center line or center k-space along with other random lines or k-space outside the center k-space region. The undersampled contrast scan data is interleaved or filled with zeros (e.g. in the phase encoding dimension), for example, in the regions outside the center k-space.

The scans for acquiring the MDME scan data and contrast scan data may occur in a single continuous imaging session (i.e., where the scans (accelerated scan and quantitative scan) occur serially in response to a single start signal or input (e.g., single-click)). The quantitative scan may be performed first followed by the accelerated scan or vice versa. In certain embodiments, acquiring the MDME scan data and contrast scan data may occur in separate scans (i.e., utilizing separate start signals).

The method 180 also includes normalizing the range of image intensities of the MDME scan data to the image intensity of the contrast scan data (block 184). The method 180 further includes grafting portions of MDME scan data into the contrast scan data to form or generate composite data (block 186). The grafting serves as a structure sharing operation. The different contrasts that can be derived from the MDME data share structure information (e.g., high frequency information). The contrasts that can be derived from the MDME data and the contrast derived from the accelerated scan also share structure information since the scan data is derived from the same subject. The high frequency information (derived from regions outside a central region) from the MDME scan data (e.g., reference data) is grafted into regions of the contrast scan data that were zero filled to form composite data (e.g., grafted k-space). Performing normalization before grafting minimizes grafting artifacts due to gain mismatch.

The method 180 still further includes transforming the MDME scan data and the composite data (block 188). In particular, the MDME scan data is transformed into synthesized contrast images 190 (e.g., two-dimensional (2D) images) and the composite data is transformed into a composite image 192. For example, the k-space data is transformed via Fourier transform (e.g., inverse fast Fourier transform (IFFT)) to image data. The composite image 192 and the synthesized contrast image 190 (or the MDME scan data) are inputted into a trained deep neural network 194 (e.g., artifact correction network or artifact prediction network) (block 196). In addition, the synthesized contrast image 190 corresponds to the type of contrast scan sequence that was utilized to provide contrast scan data to the composite image 192. For example, if the conventional contrast scan to acquire the contrast scan data was T2-FLAIR, the composite image 192 would be a synthesized T2-FLAIR image. The trained deep neural network 194 is trained (e.g., via supervised learning) to predict artifacts to be removed to generate a true or conventional contrast image akin to a ground truth image (i.e., a conventionally acquired contrast image such as a T2-FLAIR image). The method 180 still further includes generating a true (e.g., conventional) contrast image 198 (block 200).

The trained deep neural network 194 (e.g., DISO model) may be a dense neural network. The layers of the dense neural network are fully connected (e.g., dense) by neurons in a network layer. Each neuron in a layer receives an input from all the neurons present in the previous layer. A linear operation is utilized where every input is connected to every output by a weight. In certain embodiments, each dense block may include three layers. The output (true contrast image 198) of the final layer constitute the network output (e.g., one or more convolution kernel parameters, a convolution kernel, and so forth) which is compared to the composite image to compute some loss or error function, which will be backpropagated to guide the network training. The loss or error function measures the difference between the network output (e.g., a convolution kernel or kernel parameter) and the training target (e.g., composite image 192). In certain implementations, the loss function may be an index (e.g., DISO) that takes into an absolute error (AE), correlation coefficient, and uncentered root mean square error (RMSE). In certain embodiments, the loss function could be defined by other metrics associated (e.g., structural similarity index measure (SSIM)) with the particular task in question, such as a softmax function.

Prior to utilization of the artifact correct network 194, the method 180 includes training a neural network 202 with training data 204 (block 206) Training of the artifact correct network 194 is similar to the utilization of the network 194. Training datasets (as well as testing datasets) include multiple sets of separately acquired contrast images (for the same contrast type such as T2-FLAIR or different contrast types) and corresponding MDME data for multiple subjects. In particular, for each imaged subject, a contrast image (e.g., for a particular contrast type) and corresponding MDME data is utilized. Both pathology and non-pathology cases are utilized. Composite images are generated from the corresponding contrast data and MDME data and provided to the neural network 202 for training. As mentioned above, supervised learning is utilized in training the network 206.

Figure 3:
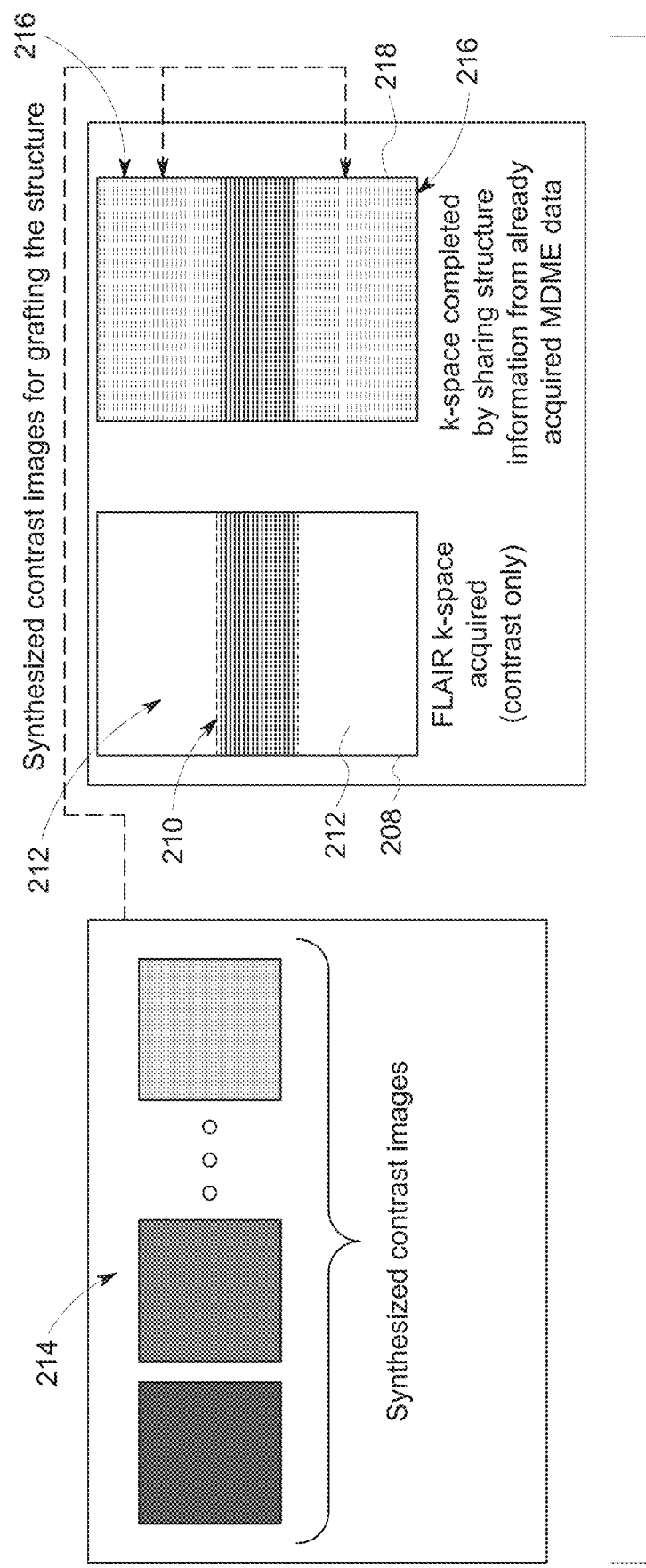
FIG. 3 is a schematic diagram depicting a grafting operation for generating composite data, in accordance with aspects of the present disclosure.

FIG. 3 is a schematic diagram depicting a grafting operation for generating composite data. As depicted, a separately acquired (e.g., utilizing a MRI contrast scan) undersampled contrast dataset or image 208 (e.g., for a particular contrast type such as T2-FLAIR) includes, in this case, center only k-space 210 with the other regions 212 zero filled. Multiple synthesized contrast images 214 (e.g., 2D images) for the same contrast type (e.g., T2-FLAIR) as the contrast dataset or image derived from MDME data previously acquired of the same subject from which the contrast dataset 208 was acquired are also depicted. It should be noted that the contrast type for the contrast dataset 208 and the synthesized contrast images do not have to be the same. In certain embodiments, all of the contrast types may be utilized. The synthesized contrast images 214 share structure information between themselves and the contrast dataset 208. During the grafting, the zero filled regions 212 are filled with the corresponding k-space 216 for those regions from the synthesized contrast images 214 (or MDME data) enabling sharing of structure information and the formation of composite data or a composite image 218.

Figure 4:
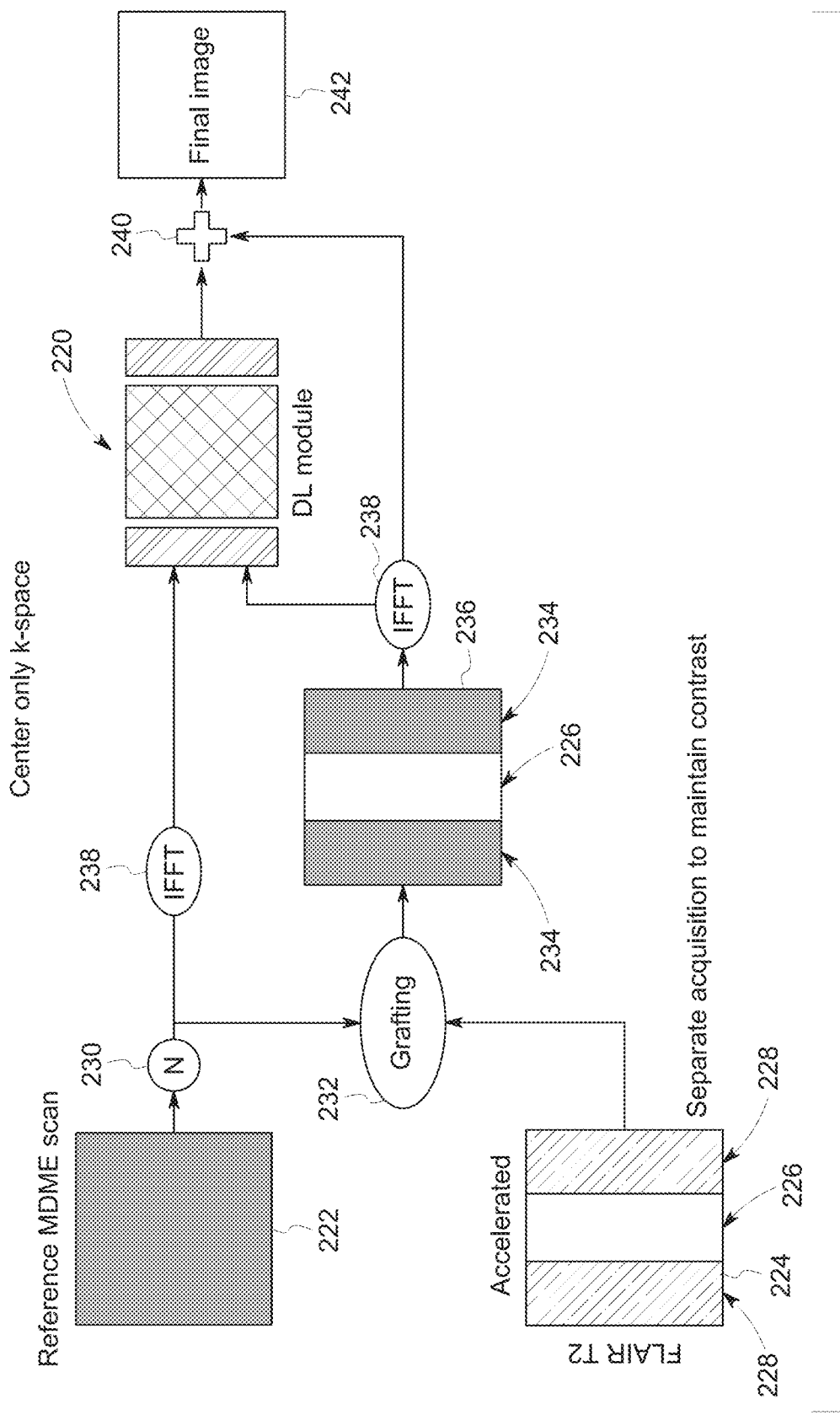
FIG. 4 is a schematic diagram depicting utilization of an artifact correction network (utilizing center only k-space data from contrast data), in accordance with aspects of the present disclosure.

FIG. 4 is a schematic diagram depicting utilization of an artifact correction network or artifact prediction network 220 (utilizing center only k-space data from contrast data). As depicted, fully sampled reference MDME data 222 is acquired utilizing an MDME sequence during a quantitative scan. As depicted, separate undersampled contrast data 224 (which is contrast only data) is acquired utilizing an accelerated MRI contrast scan of a particular contrast type (e.g., T2-FLAIR). As depicted, the contrast data 224 includes center only k-space 226 flanked by zero filled regions 228. The contrast data 224 and the reference MDME data 222 are of the same contrast type (e.g., T2-FLAIR). In certain embodiments, the contrast data 224 and the reference MDME data 222 do not have to of the same contrast type. In certain embodiments, all of the contrast types may be utilized. Prior to grafting, normalization 230 of the image intensities of the reference MDME data 222 to the image intensity of the contrast data 224 occurs. Then grafting 232 occurs. During grafting 232, k-space data of the reference MDME data 222 from outside a central region (as indicated by grafted regions 234) is grafted into the previous zero filled regions 228 to form composite data 236. Transformation 238 is then performed on both normalized reference MDME data 222 and the composite data 236 to form a reference MDME or reference contrast image and a composite image, respectively, which are inputted into the artifact correction network 220. The output of the artifact correction network 220 is compared to the composite image to determine an error or loss function 240 which may be backpropagated to the network 220 as well as utilized to help in generating the final image 242 (e.g., artifact corrected reconstruction contrast image).

Figure 5:
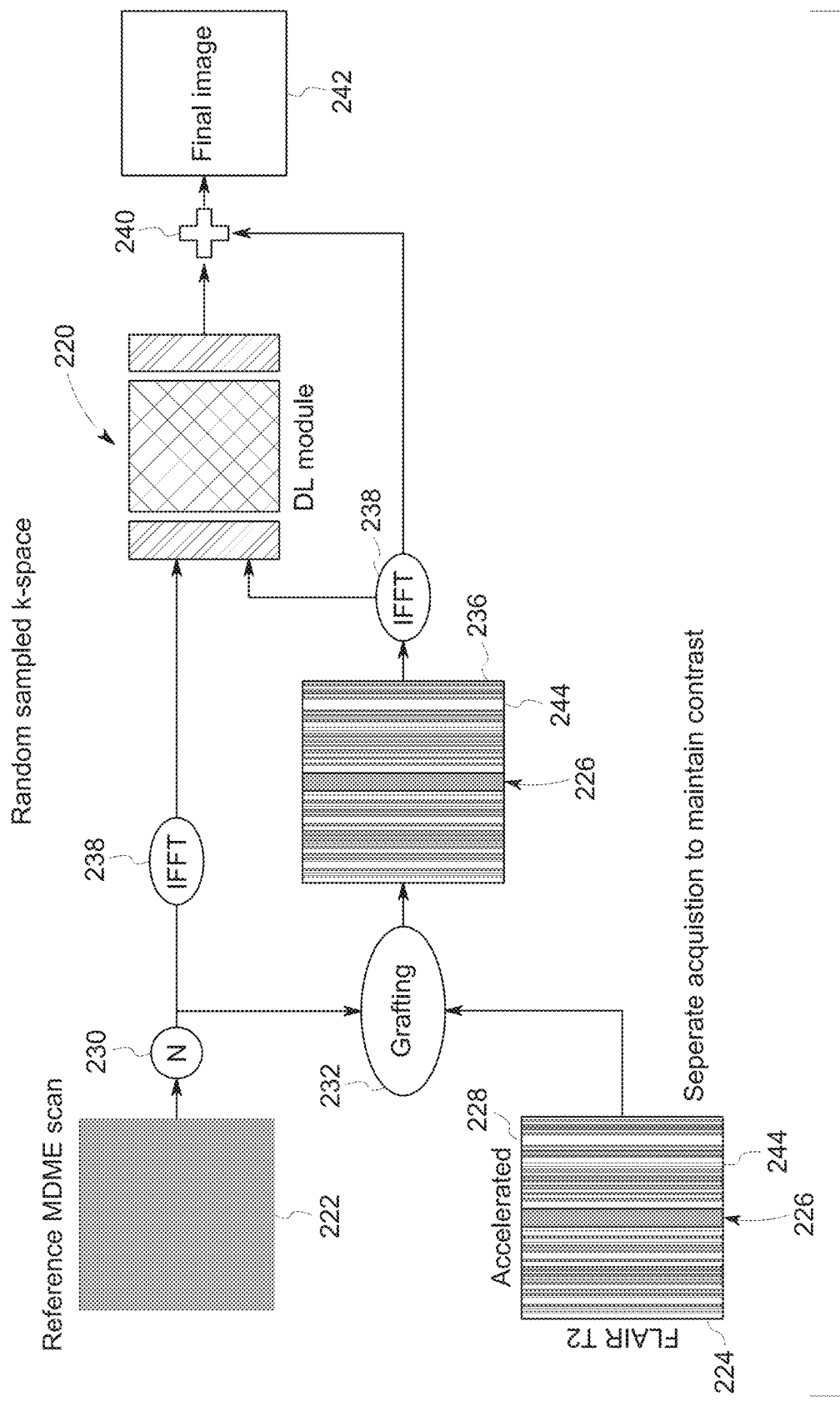
FIG. 5 is a schematic diagram depicting utilization of an artifact correction network (utilizing random k-space data from contrast data), in accordance with aspects of the present disclosure.

FIG. 5 is a schematic diagram depicting utilization of an artifact correction network or artifact prediction network 220 (utilizing center only k-space data from contrast data). As depicted, fully sampled reference MDME data 222 is acquired utilizing an MDME sequence during a quantitative scan. As depicted, separate undersampled contrast data 224 is acquired utilizing an accelerated MRI contrast scan of a particular contrast type (e.g., T2-FLAIR). As depicted, the contrast data 224 includes center k-space 226 as well as random sampled k-space 244 outside the center k-space 226 with zero filled regions 228 in between. The contrast data 224 and the reference MDME data 222 are of the same contrast type (e.g., T2-FLAIR). In certain embodiments, the contrast data 224 and the reference MDME data 222 do not have to of the same contrast type. In certain embodiments, all of the contrast types may be utilized. Prior to grafting, normalization 230 of the image intensities of the reference MDME data 222 to the image intensity of the contrast data 224 occurs. Then grafting 232 occurs. During grafting 232, k-space data of the reference MDME data 222 from outside a central region (as indicated by grafted regions 234) is grafted into the previous zero filled regions 228 to form composite data 236. Transformation 238 is then performed on both normalized reference MDME data 222 and the composite data 236 to form a reference MDME or reference contrast image and a composite image, respectively, which are inputted into the artifact correction network 220. The output of the artifact correction network 220 is compared to the composite image to determine an error or loss function 240 which may be backpropagated to the network 220 as well as utilized to help in generating the final image 242 (e.g., artifact corrected reconstruction contrast image).

Figure 6:
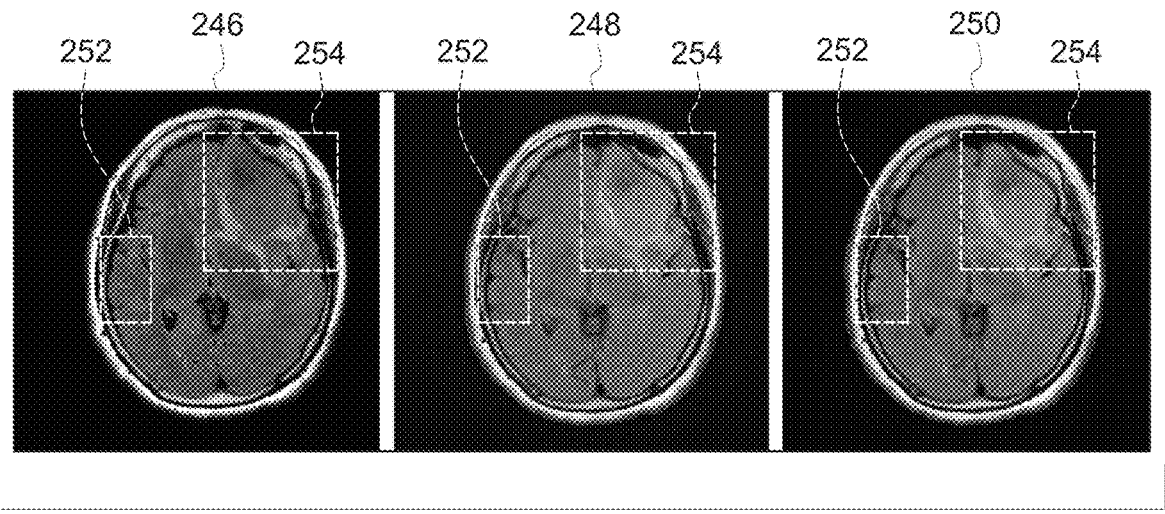
FIG. 6 illustrates a comparison of MR contrast images generated utilizing different techniques.

FIG. 6 illustrates a comparison of MR contrast images (e.g., of the same subject) generated utilizing different techniques. Image 246 is a T2-FLAIR contrast image synthesized from MDME data. Image 248 is a separately acquired conventional T2-FLAIR contrast image. Image 250 is a T2-FLAIR contrast image generated utilizing the deep learning-based techniques disclosed above. Images 248 and 250 have similar contrast in pathology regions 252, 254. In addition, cortical thickening artifacts as well as brightening artifacts present in image 246 are corrected or absent in image 250.

Figure 7:
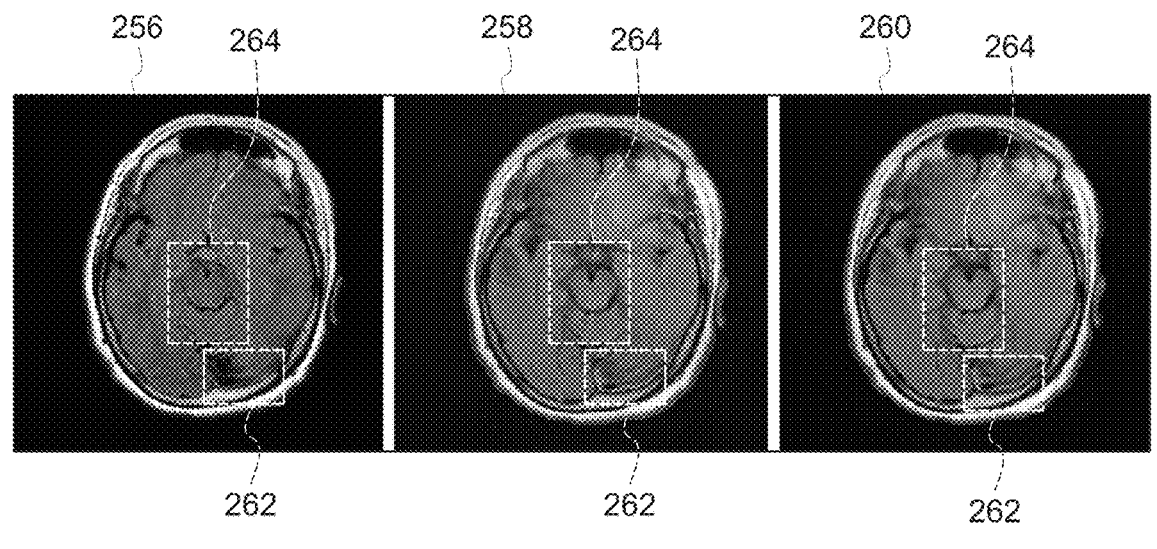
FIG. 7 illustrates a comparison of MR contrast images generated utilizing different techniques.

FIG. 7 illustrates a comparison of MR contrast images (e.g., of the same subject) generated utilizing different techniques. Image 256 is a T2-FLAIR contrast image synthesized from MDME data. Image 258 is a separately acquired conventional T2-FLAIR contrast image. Image 260 is a T2-FLAIR contrast image generated utilizing the deep learning-based techniques disclosed above. Images 258 and 260 have similar contrast in highlighted regions 262, 264.

Technical effects of the disclosed subject matter includes providing systems and methods for deep learning-based generation of true (i.e., equivalent to conventional) contrast images from synthetic MRI data. In particular, the trained deep neural network is utilized to reconstruct artifact corrected contrast images (i.e., true contrast images). Composite data or a composite image may be generated by grafting portions of k-space data (unacquired k-space) from a synthesized contrast image or images into contrast data or a contrast image (contrast-only image) containing at least a center portion of k-space data. The synthesized contrast images are generated from a MRI scan of an object of interest (e.g., region such as the brain in a patient) utilizing a multi-delay multi-echo (MDME) sequence. The contrast data or image is acquired during a scan of the same object of interest utilizing a contrast MRI sequence. The scans for acquiring the data for the synthesized contrast image and the contrast image may occur a single continuous imaging session (i.e., where the scans occur serially in response to a single start signal or input (e.g., single-click)). Prior to grafting, the image intensity of the synthesized contrast image may be normalized to the image intensity of the contrast image. The artifact corrected reconstructed contrast images outputted by the trained deep neural network have fewer artifacts than synthesized contrast images for the same contrast type. In addition, the artifact corrected reconstructed images are of similar diagnostic quality as conventionally acquired contrast images. Thus, the disclosed embodiments enable the generation of true contrast images while still utilizing data acquired utilizing the MDME sequence in a single-click multi-contrast imaging scheme.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for generating an artifact corrected reconstructed contrast image from magnetic resonance imaging (MRI) data, comprising:
   inputting into a trained deep neural network both a synthesized contrast image derived from multi-delay multi-echo (MDME) scan data or the MDME scan data acquired during a first scan of an object of interest utilizing a MDME sequence and a composite image, wherein the composite image is derived from both the MDME scan data and contrast scan data acquired during a second scan of the object of interest utilizing a contrast MRI sequence;
   utilizing the trained deep neural network to generate the artifact corrected reconstructed contrast image based on both the synthesized contrast image or the MDME scan data and the composite image; and
   outputting from the trained deep neural network the artifact corrected reconstructed contrast image.

2. The computer-implemented method of claim 1, wherein the second scan is an accelerated scan resulting in acquisition of partial k-space data.

3. The computer-implemented method of claim 1, wherein the first scan and the second scan are performed in a single continuous imaging session in response to a single start input.

4. The computer-implemented method of claim 1, wherein the first scan and the second scan are performed separately.

5. The computer-implemented method of claim 1, wherein the contrast scan data comprises at least a center portion of k-space data.

6. The computer-implemented method of claim 5, wherein the contrast scan data comprises random k-space data outside the center portion of k-space data.

7. The computer-implemented method of claim 5, comprising grafting k-space data from the MDME scan data into zero filled regions outside the center portion of k-space data of the contrast scan data to provide shared structure information to generate composite data from which the composite image is derived.

8. The computer-implemented method of claim 7, comprising normalizing image intensity of the MDME scan data to an image intensity of the contrast scan data prior to grafting.

9. The computer-implemented method of claim 1, wherein the artifact corrected reconstructed contrast image comprises a T2-FLAIR image.

10. The computer-implemented method of claim 1, wherein the artifact corrected reconstructed contrast image has fewer artifacts compared to a same type of contrast image synthesized solely from the MDME scan data.

11. The computer-implemented method of claim 1, comprising training a neural network using supervised learning to generate the trained deep neural network, wherein training data used for the supervised learning comprises composite images generated from both contrast scan data acquired during different scans of objects of interest utilizing the contrast MRI sequence and corresponding synthesized contrast images generated from separate scans of the objects of interest utilizing the MDME sequence.

12. A deep learning-based artifact correction system for generating an artifact corrected reconstructed contrast image from magnetic resonance imaging (MRI) data, comprising:
   a memory encoding processor-executable routines;
   a processing component configured to access the memory and to execute the processor-executable routines, wherein the routines, when executed by the processing component, cause the processing component to:
      input into a trained deep neural network both a synthesized contrast image derived from multi-delay multi-echo (MDME) scan data or the MDME scan data acquired during a first scan of an object of interest utilizing a MDME sequence and a composite image, wherein the composite image is derived from both the MDME scan data and contrast scan data acquired during a second scan of the object of interest utilizing a contrast MRI sequence, wherein image intensity of the MDME scan data is normalized to an image intensity of the contrast scan data prior to generation of the composite image;
      utilize the trained deep neural network to generate the artifact corrected reconstructed contrast image based on both the synthesized contrast image or the MDME scan data and the composite image; and
      output from the trained deep neural network the artifact corrected reconstructed contrast image.

13. The system of claim 12, wherein the second scan is an accelerated scan resulting in acquisition of partial k-space data.

14. The system of claim 12, wherein the first scan and the second scan are performed in a single continuous imaging session in response to a single start input.

15. The system of claim 12, wherein the first scan and the second scan are performed separately.

16. The system of claim 12, wherein the contrast scan data comprises at least a center portion of k-space data.

17. The system of claim 16, wherein the contrast scan data comprises random k-space data outside the center portion of k-space data.

18. The system of claim 16, wherein the routines, when executed by the processing component, cause the processing component to graft k-space data from the MDME scan data into zero filled regions outside the center portion of k-space data of the contrast scan data to provide shared structure information to generate composite data from which the composite image is derived.

19. The system of claim 12, wherein the artifact corrected reconstructed contrast image comprises a T2-FLAIR image.

20. A non-transitory computer-readable medium, the computer-readable medium comprising processor-executable code that when executed by a processor, causes the processor to:
  input into a trained deep neural network both a synthesized contrast image derived from multi-delay multi-echo (MDME) scan data or the MDME scan data acquired during a first scan of an object of interest utilizing a MDME sequence and a composite image, wherein the composite image is derived from both the MDME scan data and contrast scan data acquired during a second scan of the object of interest utilizing a contrast MRI sequence, wherein image intensity of the MDME scan data is normalized to an image intensity of the contrast scan data prior to generation of the composite image;
  utilize the trained deep neural network to generate an artifact corrected reconstructed contrast image based on both the synthesized contrast image or the MDME scan data and the composite image; and
  output from the trained deep neural network the artifact corrected reconstructed contrast image.

* * * * *